(12) United States Patent
Song et al.

(10) Patent No.: US 11,726,111 B2
(45) Date of Patent: Aug. 15, 2023

(54) TEST DEVICE

(71) Applicant: LEENO INDUSTRIAL INC., Busan (KR)

(72) Inventors: Changhyun Song, Busan (KR); Jaehwan Jeong, Busan (KR)

(73) Assignee: LEENO INDUSTRIAL INC.

( * ) Notice: Subject to any disclaimer, the term of this patent is extended or adjusted under 35 U.S.C. 154(b) by 0 days.

(21) Appl. No.: 17/705,639

(22) Filed: Mar. 28, 2022

(65) Prior Publication Data

US 2022/0214377 A1    Jul. 7, 2022

Related U.S. Application Data

(60) Division of application No. 16/850,116, filed on Apr. 16, 2020, now Pat. No. 11,391,757, which is a
(Continued)

(30) Foreign Application Priority Data

Nov. 30, 2017 (KR) .................... 10-2017-0162775

(51) Int. Cl.
*G01R 1/04* (2006.01)
*G01R 1/067* (2006.01)
(Continued)

(52) U.S. Cl.
CPC ......... *G01R 1/06772* (2013.01); *G01R 1/045* (2013.01); *G01R 31/26* (2013.01); *G01R 31/2886* (2013.01); *G01R 31/70* (2020.01)

(58) Field of Classification Search
CPC .......... G01R 1/04; G01R 1/067; G01R 1/073; G01R 1/18; G01R 31/02; G01R 31/26; G01R 31/28; G01R 31/70
See application file for complete search history.

(56) References Cited

U.S. PATENT DOCUMENTS

| 5,659,255 A | 8/1997 | Strid et al. |
| 2004/0095157 A1* | 5/2004 | Sato .................... G01R 1/07371 |
| | | 324/756.01 |

(Continued)

FOREIGN PATENT DOCUMENTS

| EP | 1422530 A2 | 5/2004 |
| JP | S64-071141 A | 3/1989 |

(Continued)

OTHER PUBLICATIONS

Korean Office Action (KR 10-2017-0162775), KIPO, dated Oct. 30, 2018.
(Continued)

*Primary Examiner* — Neel D Shah
(74) *Attorney, Agent, or Firm* — Park & Associates IP Law Office

(57) ABSTRACT

A test device for a high-speed/high-frequency test. The test device includes: a conductive block which includes a probe hole; at least one signal probe which is supported in an inner wall of the probe hole without contact, includes a first end to be in contact with a testing contact point of the object to be tested, and is retractable in a lengthwise direction; and a coaxial cable which includes a core wire to be in electric contact with a second end of the signal probe. With this test device, the coaxial cable is in direct contact with the signal probe, thereby fully blocking out noise in a test circuit board.

4 Claims, 7 Drawing Sheets

Related U.S. Application Data continuation of application No. PCT/KR2018/014396, filed on Nov. 22, 2018.

(51) Int. Cl.
*G01R 1/073* (2006.01)
*G01R 1/18* (2006.01)
*G01R 31/26* (2020.01)
*G01R 31/28* (2006.01)
*G01R 31/70* (2020.01)

(56) References Cited

U.S. PATENT DOCUMENTS

| | | | |
|---|---|---|---|
| 2006/0094134 A1* | 5/2006 | Yoshida | G01R 1/045 257/48 |
| 2010/0062629 A1 | 3/2010 | Feldman et al. | |
| 2011/0057664 A1 | 3/2011 | Miyata | |
| 2016/0104956 A1 | 4/2016 | Santos et al. | |
| 2018/0196096 A1* | 7/2018 | Jeong | G01R 29/0835 |

FOREIGN PATENT DOCUMENTS

| | | |
|---|---|---|
| JP | 06-052748 B2 | 7/1994 |
| JP | H06-317624 A | 11/1994 |
| JP | 07-167906 A | 7/1995 |
| JP | 2001-099889 A | 4/2001 |
| JP | 2003-270291 A | 9/2003 |
| JP | 2004-170182 A | 6/2004 |
| JP | 2012-502277 A | 1/2012 |
| KR | 10-2010-0095142 A | 8/2010 |
| KR | 10-2017-0110346 A | 10/2017 |
| TW | I410637 B | 10/2013 |
| TW | 201734469 A | 10/2017 |
| WO | 2009098770 A1 | 8/2009 |

OTHER PUBLICATIONS

International Search Report (PCT/KR2018/014396), WIPO, dated Feb. 12, 2019.
Korean Notice of Allowance (KR 10-2017-0162775), KIPO, dated May 22, 2019.
Taiwan Office Action with Search Report (TW 107141560), TIPO, dated Jun. 27, 2019.
Taiwan Office Action with Search Report (TW 107141560), TIPO, dated Jan. 14, 2020.
Extended European Search Report (EP 18883317.2), EPO, dated Jul. 24, 2020.
Japanese Office Action (JP2020-541331), JPO, dated May 11, 2021.

* cited by examiner

TEST DEVICE

REFERENCE TO RELATED APPLICATIONS

This is a divisional of pending U.S. patent application Ser. No. 16/850,116 filed on Apr. 16, 2020, which is a continuation of International Patent Application PCT/KR2018/014396 filed on Nov. 22, 2018, which designates the United States and claims priority of Korean Patent Application No. 10-2017-0162775 filed on Nov. 30, 2017, the entire contents of which are incorporated herein by reference.

FIELD OF THE INVENTION

The present disclosure relates to a test device, and more particularly to a test device for a high-speed and high-frequency test, which effectively blocks out noise from an adjacent signal line and is excellent in signal transmission characteristics.

BACKGROUND OF THE INVENTION

To test electric characteristics of an object to be tested such as a semiconductor, a test device has employed a probe socket for supporting a test probe, and a test circuit board for contacting the test probe and applying a test signal. As a high-frequency and high-speed semiconductor is decreased in pitch and increased in allowable current, a noise shield between signal probes of the probe socket has become very important. That is, the mechanical length, impedance matching, etc. of the test circuit board have become important as test speed and frequency get higher.

A conventional test device includes a probe socket for supporting a signal probe, and a test circuit board placed under the probe socket and providing a test signal. The probe socket performs a test as the signal probe is inserted in a conductive brass block without contact. Further, the test circuit board includes a signal pad and a conductive column formed on an insulating dielectric substrate and transmitting the test signal. When the high-frequency and high-speed semiconductor or the like object that requires high isolation is subjected to the test, a conductive ground body has been used to shield adjacent signal probes of the probe socket from each other. However, for a more reliable test, there is a need of managing an isolation loss caused by noise made between the conductive columns and between the signal pads of the test circuit board. Further, the test circuit board includes a wiring line having a predetermined length, and thus a signal loss is caused corresponding to the length of the wiring line, thereby deteriorating signal transmission characteristics.

SUMMARY OF THE INVENTION

An aspect of the present disclosure is conceived to solve the conventional problems, and provides a test device which effectively blocks out noise between adjacent signal lines and tests a high-frequency and high-speed semiconductor excellent in transmission characteristics of a test signal.

In accordance with an embodiment of the present disclosure, there is provided a test device. The test device includes: a conductive block which includes a probe hole; at least one signal probe which is supported in an inner wall of the probe hole without contact, includes a first end to be in contact with a testing contact point of the object to be tested, and is retractable in a lengthwise direction; and a coaxial cable which includes a core wire to be in electric contact with a second end of the signal probe. Thus, the test device certainly blocks out noise between the signal probes on a cable supporting substrate and enhances the transmission characteristics of the test signal.

The test device may further include a cable accommodating hole in which the coaxial cable is accommodated, and a cable supporter which includes a cable supporting block coupled to the conductive block so that the probe hole corresponds to the cable accommodating hole, thereby firmly supporting the coaxial cable.

The cable supporting block may include a cable supporting recess for supporting the coaxial cable, thereby preventing the coaxial cable from moving.

The cable supporter may include an extended plate portion integrally extended from the cable supporting block, thereby preventing interference between the coaxial cables.

The cable supporter may include a cable supporting substrate having a through hole through which the cable supporting block passes, thereby stably fastening the cable supporting block to the conductive block.

With this test device, the coaxial cable is in direct contact with the signal probe, thereby fully blocking out noise in a test circuit board.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF THE INVENTION

Below, a test device 1 according to a first embodiment of the present disclosure will be described in detail with reference to the accompanying drawings.

Figure 1:
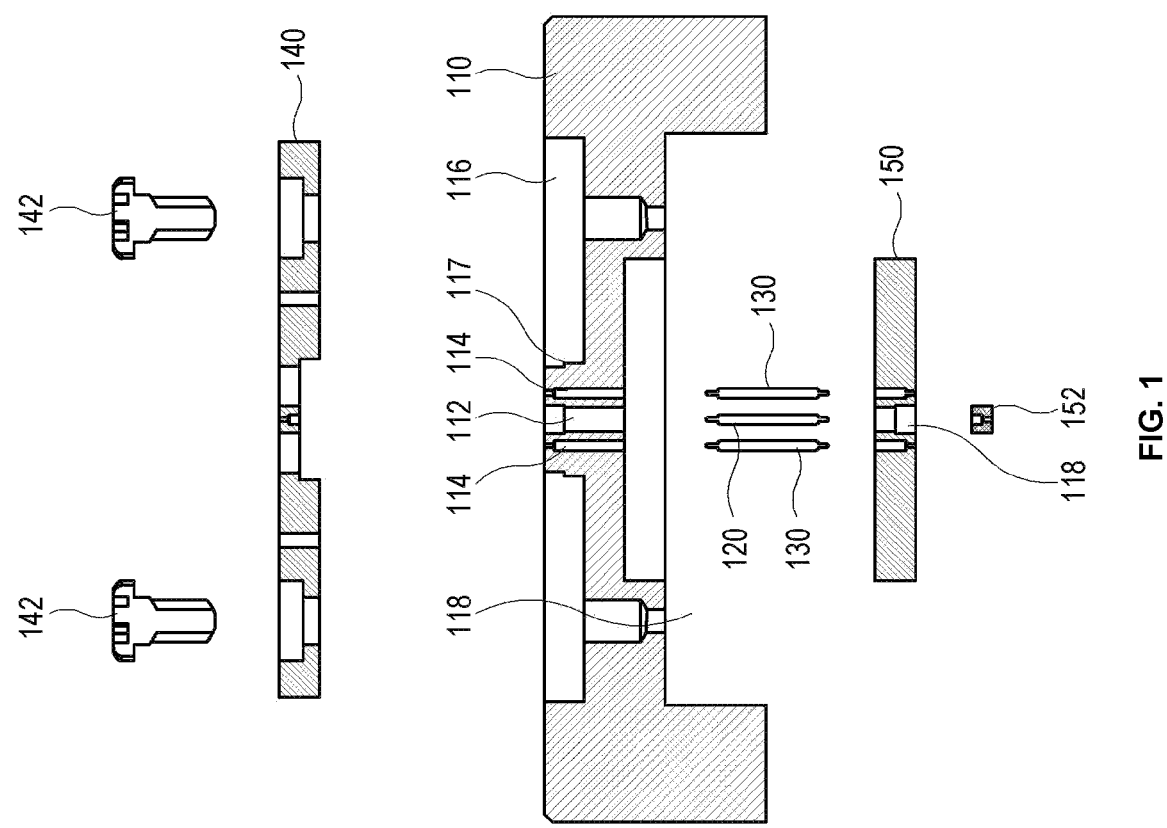
FIG. 1 is an exploded cross-sectional view of a test socket in a test device according to a first embodiment of the present disclosure.

FIG. 1 is an exploded cross-sectional view of a test socket in the test device 1 according to a first embodiment of the present disclosure, and FIGS. 2 to 6 are respectively a plane view, a bottom perspective view, an exploded perspective view, a cross-sectional view and a partial enlarged cross-sectional view of the test device 1 according to the first embodiment of the present disclosure. As shown therein, the test device 1 includes a test socket 100, a coaxial cable 200, and a cable supporter 300.

Referring to FIG. 1, the test socket 100 includes a conductive block 110 having at least one signal probe hole 112 and at least one ground probe hole 114; a signal probe 120 contactless-accommodated in the signal probe hole 112;

a ground probe 130 contact-accommodated in the ground probe hole 114; an upper supporting member 140 for supporting an upper end of the signal probe 120, and a lower supporting member 150 for supporting a lower end of the signal probe 120.

The conductive block 110 includes an upper supporting member accommodating groove 116 on an upper side to accommodate the upper supporting member 140. The upper supporting member accommodating groove 116 includes a shield island 117 protruding at the center. The shield island 117 blocks out noise made in the signal probes 120 supported on the non-conductive upper supporting member 140. The signal probe 120 in the middle passes through the signal probe hole 112 without contact, and is then supported on the upper supporting member 140.

The signal probe 120 has an upper end to be in contact with a testing contact point (not shown) of an object to be tested, and a lower end to be in contact with a core wire 210 of the coaxial cable 200. The signal probe 120 applies a test signal through the core wire 210 of the coaxial cable 200. The signal probe 120 may be materialized by a retractable Pogo pin. The signal probe 120 includes a barrel (not shown), upper and lower plungers (not shown) partially inserted in the opposite ends of the barrel, and a spring (not shown) arranged between the upper and lower plungers within the barrel. At least one of the upper and lower plungers is inserted in the barrel and slide to compress the spring within the barrel.

The ground probe 130 having an upper end to be in contact with a ground terminal of an object to be tested (not shown), and a lower end to be in contact with the cable supporter 300. The ground probe 130 receives a ground signal from the object to be tested. The ground probe 130 may be may be materialized by a retractable Pogo pin. The ground probe 130 includes a barrel (not shown), upper and lower plungers (not shown) partially inserted in the opposite ends of the barrel, and a spring (not shown) arranged between the upper and lower plungers within the barrel. At least one of the upper and lower plungers is inserted in the barrel and slide to compress the spring within the barrel. The ground probe 130 is supported being in contact with the conductive block 110.

Figure 2:
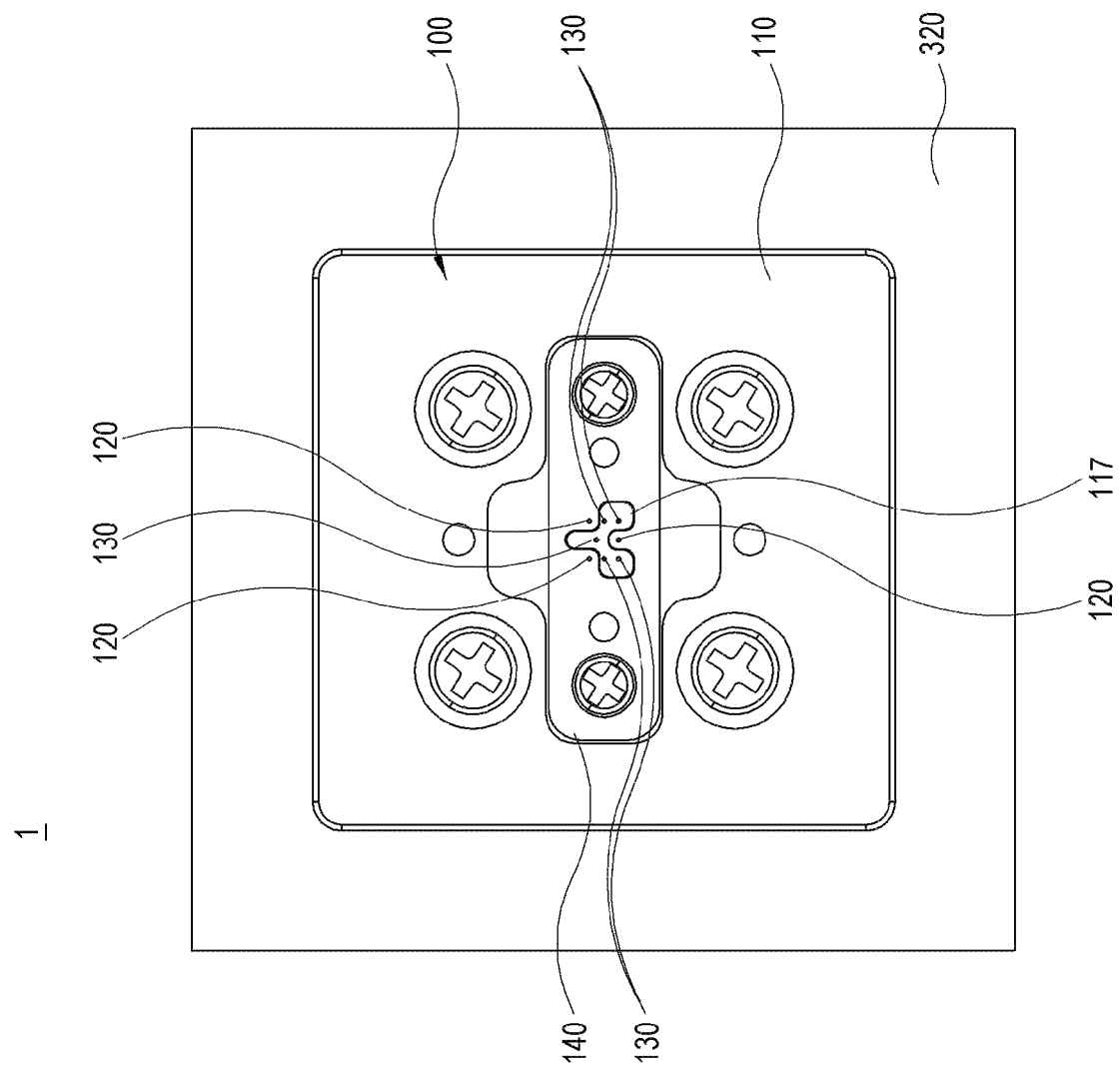
FIG. 2 is a plane view of the test device according to the first embodiment of the present disclosure.
Figure 3:
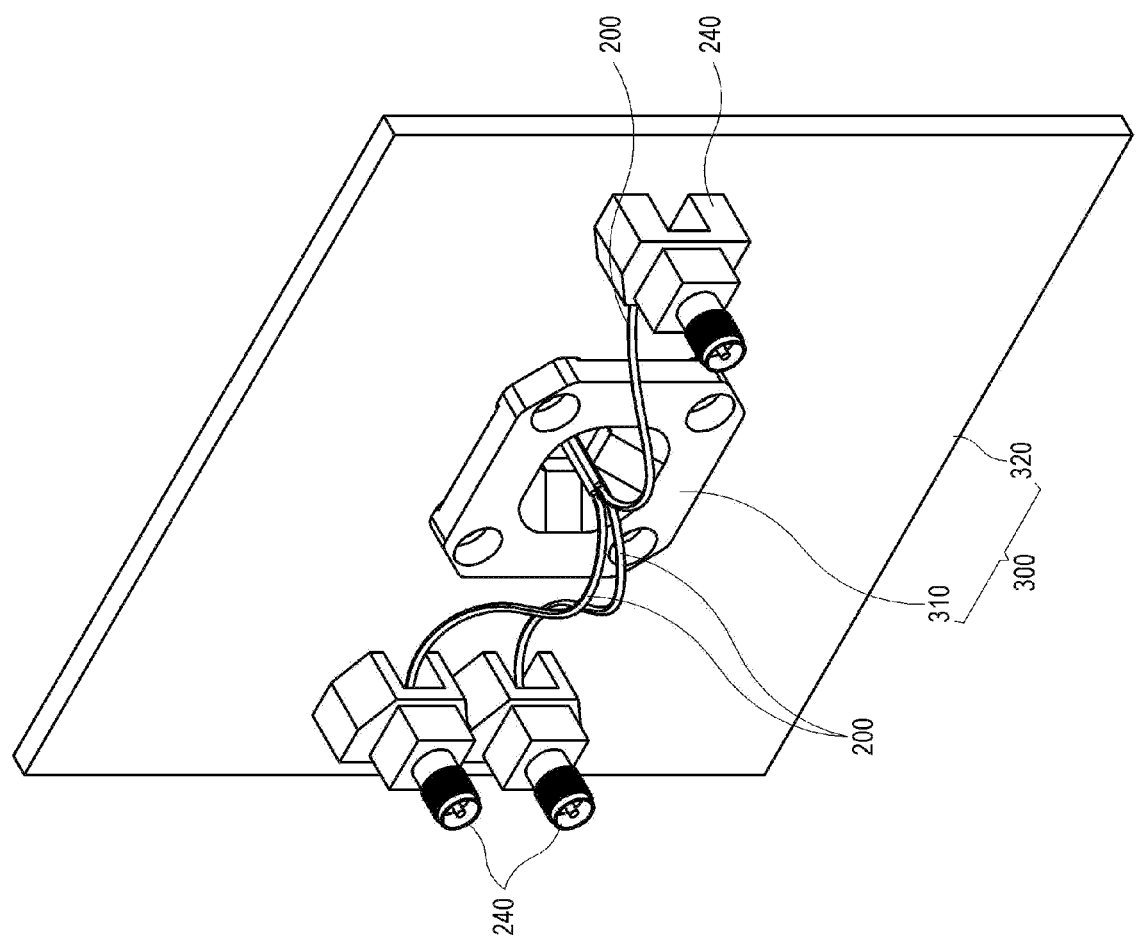
FIG. 3 is a bottom perspective view of the test device according to the first embodiment of the present disclosure.
Figure 4:
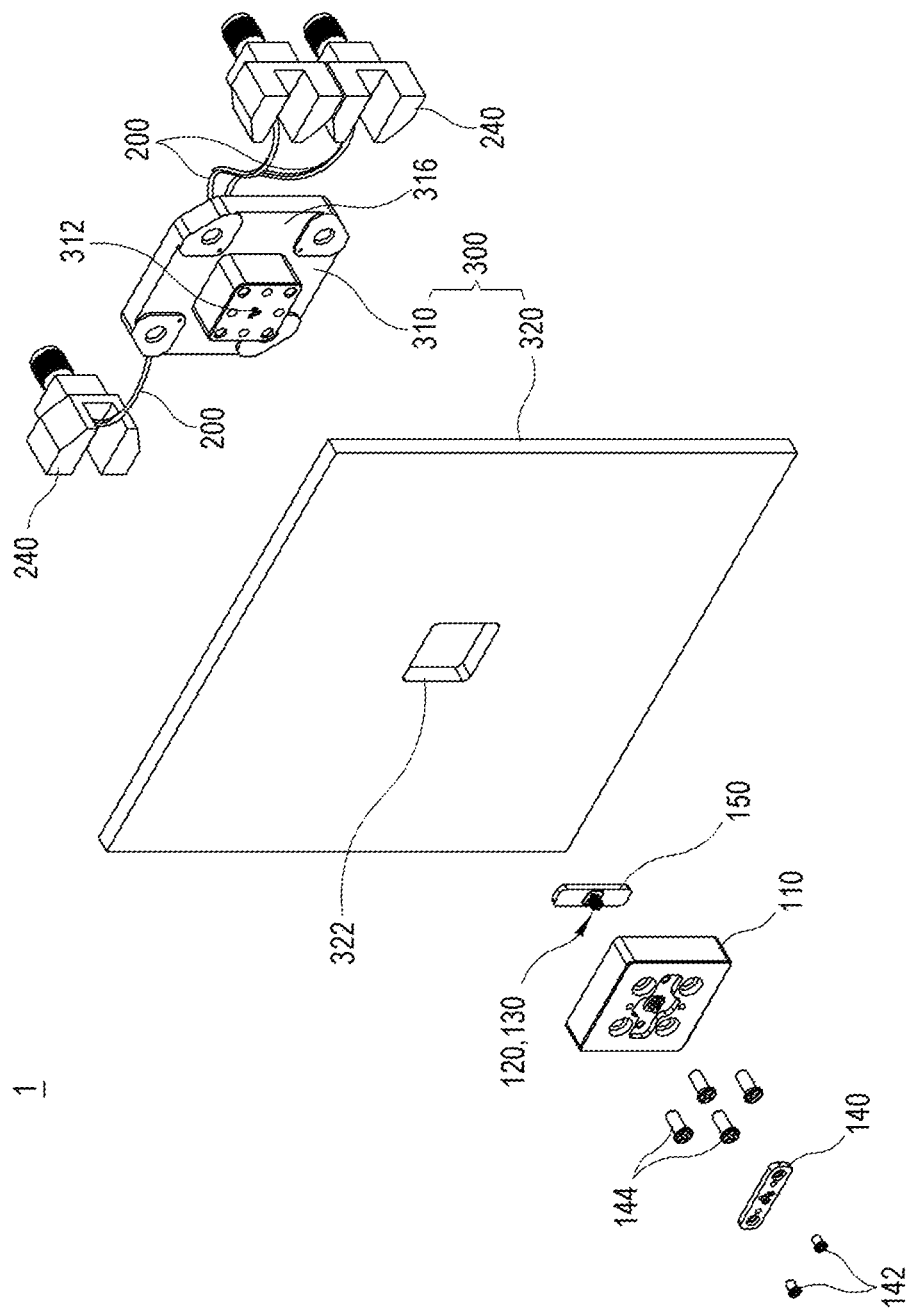
FIG. 4 is an exploded perspective view of the test device according to the first embodiment of the present disclosure.
Figure 5:
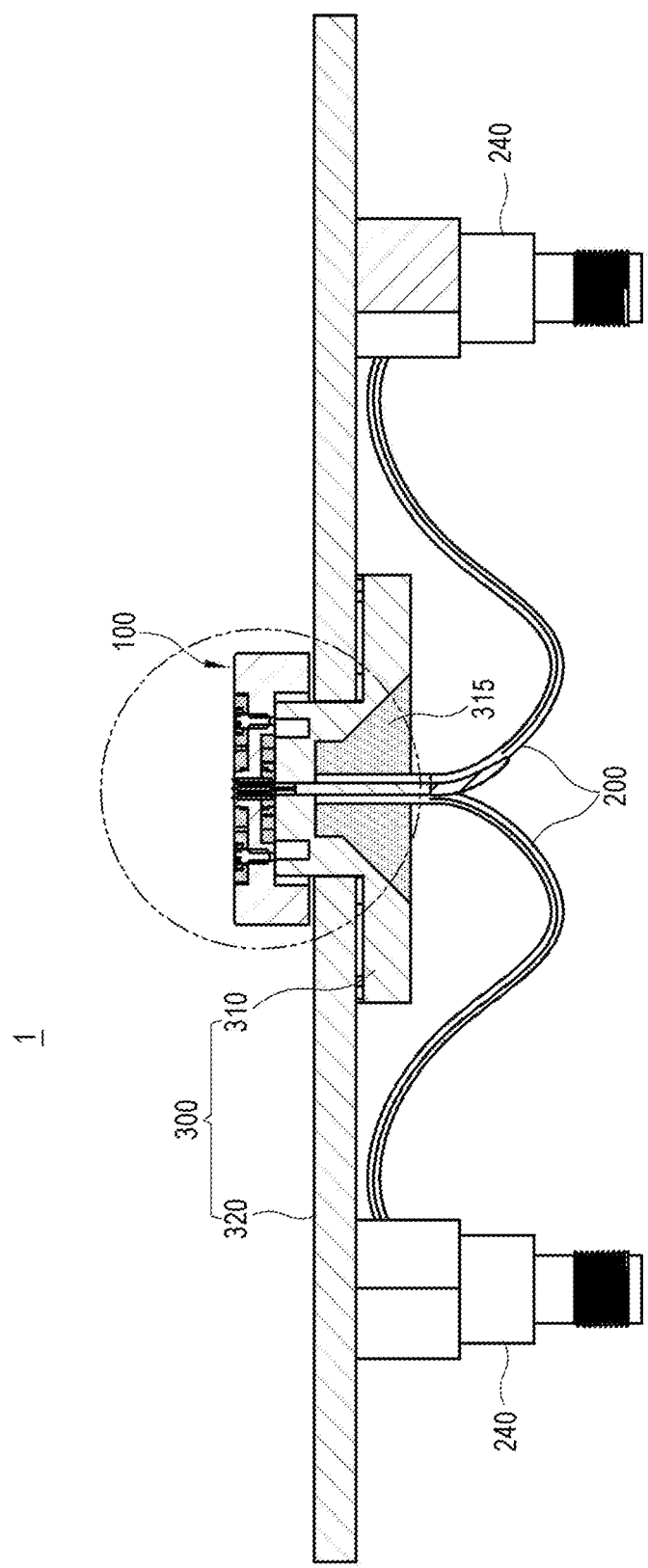
FIG. 5 is a cross-sectional view of the test device according to the first embodiment of the present disclosure.
Figure 6:
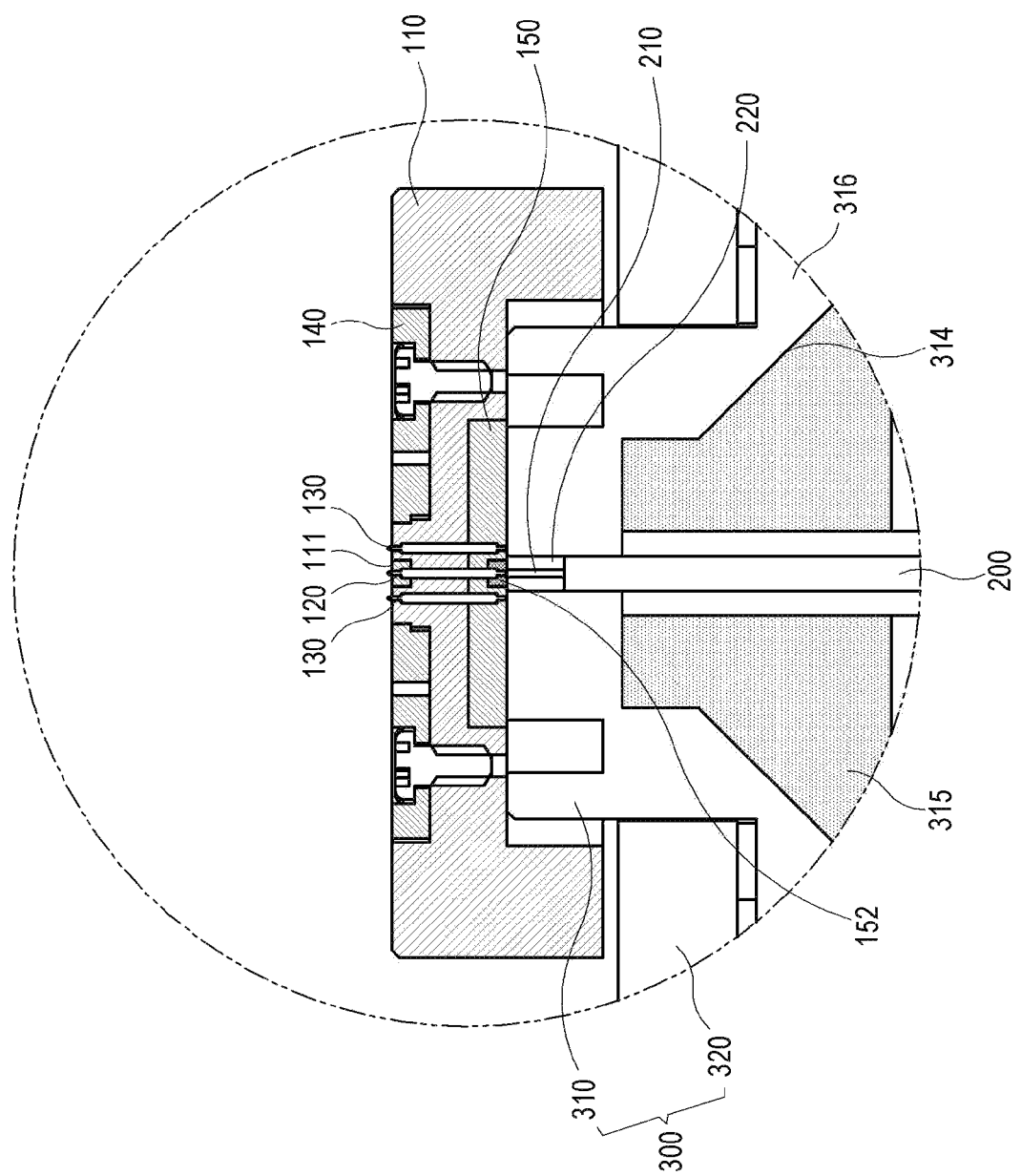
FIG. 6 is a partial enlarged cross-sectional view illustrating a detailed coupling state between a signal probe and a coaxial cable according to the first embodiment of the present disclosure.

Referring to FIG. 1 and FIG. 2, the shield island 117 is interposed among three signal probe 120, and five ground probe 130 are supported being in contact with the shield island 117. In result, the grounded shield island 117 shields the signal probes 120 from noise.

The upper supporting member 140 is fastened to the conductive block 110 by a first screw 142 as accommodated in the upper supporting member accommodating groove 116, thereby supporting the signal probe 120. The signal probe 120 is inserted in the signal probe hole 112 of the conductive block 110 without contact as floating to prevent a short-circuit. To this end, the insulating upper supporting member 140 supports the upper end of the signal probe 120.

Similarly, the lower supporting member 150 is made of a conductive material and is accommodated in a lower supporting member accommodating groove 118 to support the lower end of the signal probe 120. The signal probe 120 is inserted in the signal probe hole 112 of the conductive block 110 without contact as floating to prevent a short-circuit. The lower supporting member 150 includes an insulating signal probe supporting member 152 to support the lower end of the signal probe 120. In result, the signal probe 120 passes through the conductive block 110 and the lower supporting member 150 without contact, and the opposite ends of the signal probe 120 are supported by the upper supporting member 140 and the signal probe supporting member 152.

The signal probe hole 112 and the ground probe hole 114 are formed penetrating the upper supporting member 140, the conductive block 110 and the lower supporting member 150. The signal probe 120 is inserted in the signal probe hole 112 without contact, and the ground probe 130 is inserted in and contacts the ground probe hole 114. In this case, both ends of each of the signal probe 120 and the ground probe 130 partially protrude from the top and bottom surfaces of the upper supporting member 140 and the conductive block 110.

The coaxial cable 200 includes a core wire 210 placed at the core and transmitting a signal, an external conductor 220 surrounding the outer portion of the core wire 210 as separated from the core wire 210 to block out the noise, and an insulator 230 filled in between the core wire 210 and the external conductor 220. The core wire 210 of the coaxial cable 200 is grinded for contact with the signal probe 120. The coaxial cable 200 has a first end contacting the signal probe 120 and supported on a cable supporting block 310 (to be described later), and a second end supported on a cable supporting substrate 320 positioned as separated from the first end. The coaxial cable 200 includes a signal connector 240 to receive a test signal from the outside. The signal connector 240 is mounted to the cable supporting substrate 320.

The cable supporter 300 includes the cable supporting block 310 having a cable accommodating hole 312 for accommodating the coaxial cable 200, and the cable supporting substrate 320 mounted with the test socket 100.

The cable supporting block 310 includes a plurality of cable accommodating holes 312 at positions corresponding to the signal probe holes 112 of the lower supporting member 150. The cable supporting block 310 may be made of conductive metal. The cable supporting block 310 is coupled to the conductive block 110 by a second screw 144 as inserted in a through hole 322 of the cable supporting substrate 320. The cable supporting block 310 includes a cable supporting recess 314 (see FIG. 6) which is recessed from a surface opposite to an area where the cable supporting block is coupled to the conductive block 110, and an extended plate portion 316 extended transversely. The coaxial cable 200 is inserted in the cable accommodating hole 312 of the cable supporting recess 314 and secured in place with adhesive (or glue) 315 filled in the cable supporting recess 314 and hardened. The extended plate portion 316 is in contact with a rear side of the cable supporting substrate 320 and supports the cable supporting substrate 320 along with the test socket 100.

The cable supporting substrate 320 includes one side onto which the test socket 100 is mounted, and the rear side to which the second ends of the coaxial cables 200 are separately attached for blocking out the noise. The cable supporting substrate 300 includes the through hole 322 in which the cable supporting block 310 is accommodated while penetrating the cable supporting substrate 300.

Figure 7:
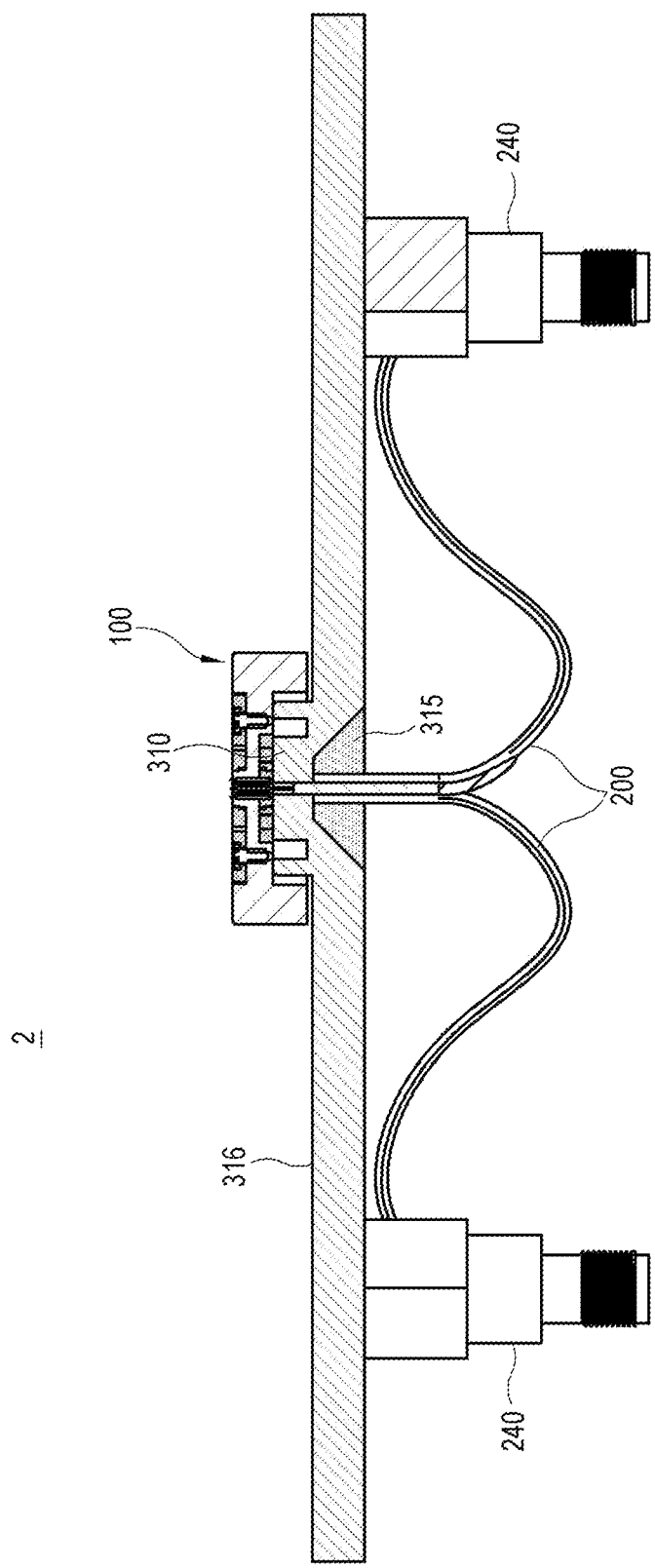
FIG. 7 is a cross-sectional view of a test device according to a second embodiment of the present disclosure.

FIG. 7 is a cross-sectional view of a test device 2 according to a second embodiment of the present disclosure. In comparison with the test device 1 described with reference to FIGS. 1 to 6, like numerals refer to like elements, and only different parts will be described.

As shown therein, the test device 2 includes the test socket 100, the coaxial cable 200, and the cable supporter 300.

The cable supporter 300 does not include the cable supporting substrate 320 unlike that of the first embodiment, and the signal connector 240 is fastened to the extended plate portion 316 instead of the cable supporting substrate 320.

In the test device according to the present disclosure, the signal probe supported in the conductive block is in direct contact with the core wire of the coaxial cable, thereby certainly blocking out the noise between the signal lines at a side of an test circuit board and improving the transmission characteristics of the test signal. Thus, the test device according to the present disclosure enhances the test reliability at a high-speed/high-frequency test.

Although the present disclosure is described through a few exemplary embodiments and drawings, the present invention is not limited to the foregoing exemplary embodiments and it will be appreciated by a person having an ordinary skill in the art that various modifications and changes can be made from these embodiments.

Therefore, the scope of the present disclosure has to be defined by not the exemplary embodiments but appended claims and the equivalents.

What is claimed is:

1. A test device for testing electric characteristics of an object, the test device comprising:
    a conductive block including at least one signal probe hole for accommodating at least one signal probe therein without contacting an inner wall of the signal probe hole, and at least one ground probe hole for accommodating at least one ground probe therein while allowing contacting an inner wall of the ground probe hole;
    an upper supporting member mounted on an upper surface of the conductive block, the upper supporting member including at least one signal probe hole at locations corresponding to the at least one signal probe hole of the conductive block, the signal probe hole of the upper supporting member being configured to support an upper end of the signal probe introduced thereto through the signal probe hole of the conductive block;
    a lower supporting member mounted under a lower surface of the conductive block, the lower supporting member including at least one signal probe hole at locations corresponding to the at least one signal probe hole of the conductive block, the signal probe hole of the lower supporting member being configured to support a lower end of the signal probe introduced thereto through the signal probe hole of the conductive block;
    a coaxial cable including a core wire configured to be in electric contact with the lower end of the signal probe, and
    a cable supporter which includes a cable supporting block, the cable supporting block including a cable accommodating hole for accommodating the coaxial cable therein to provide the electric contact with the lower end of the signal probe,
    wherein the cable supporting block comprises a cable supporting recess recessed from a surface opposite to an area where the cable supporting block is coupled to the conductive block,
    wherein the coaxial cable is secured in place with adhesive filled in the cable supporting recess and hardened.

2. The test device according to claim 1, wherein the conductive block includes a shield island projected upwardly from an upper surface of the conductive block and configured to shield noise from the at least one signal probe accommodated in the conductive block.

3. The test device according to claim 2, wherein the cable supporting block comprises an extended plate portion extended laterally from the cable supporting block.

4. The test device according to claim 2, wherein the cable supporter comprises a cable supporting substrate which includes a through hole through which the cable supporting block is inserted for coupling.

* * * * *